(12) United States Patent
Gao

(10) Patent No.: US 10,443,119 B2
(45) Date of Patent: Oct. 15, 2019

(54) MASK PLATE FRAME AND MASK PLATE ASSEMBLY

(71) Applicant: BOE TECHNOLOGY GROUP CO., LTD., Beijing (CN)

(72) Inventor: Jing Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/817,403

(22) Filed: Nov. 20, 2017

(65) Prior Publication Data
US 2018/0148824 A1 May 31, 2018

(30) Foreign Application Priority Data

Nov. 30, 2016 (CN) .................. 2016 2 1301738 U

(51) Int. Cl.
*C23C 14/04* (2006.01)
*B05B 12/20* (2018.01)
*H01L 51/00* (2006.01)

(52) U.S. Cl.
CPC ............ *C23C 14/042* (2013.01); *B05B 12/20* (2018.02); *H01L 51/0011* (2013.01)

(58) Field of Classification Search
USPC ......................... 118/504, 505, 721
See application file for complete search history.

(56) References Cited

U.S. PATENT DOCUMENTS

| 2004/0123799 | A1* | 7/2004 | Clark | ............... C23C 14/042 |
| | | | | 118/504 |
| 2011/0159774 | A1* | 6/2011 | Song | ............... C23C 14/042 |
| | | | | 445/60 |
| 2016/0369388 | A1* | 12/2016 | Ma | ............... C23C 16/04 |

* cited by examiner

*Primary Examiner* — Yewebdar T Tadesse
(74) *Attorney, Agent, or Firm* — Brooks Kushman P.C.

(57) ABSTRACT

A mask plate frame and a mask plate assembly are provided, the mask plate frame includes: a first frame body provided with a first supporting portion and a second supporting portion and a second frame body arranged on a supporting surface of the first supporting portion. A first distance between the supporting surface of the first supporting portion and a bottom surface of the first frame body is larger than a second distance between a supporting surface of the second supporting portion and the bottom surface of the first frame body; and an orthogonal projection of the second supporting portion onto a plane parallel to the bottom surface of the first frame body is within an orthogonal projection of the first supporting portion onto the plane parallel to the bottom surface of the first frame body.

13 Claims, 6 Drawing Sheets

MASK PLATE FRAME AND MASK PLATE ASSEMBLY

CROSS-REFERENCE TO RELATED APPLICATION

This application claims priority to Chinese Patent Application No. 201621301738.2 filed Nov. 30, 2016, which is incorporated herein by reference in its entirety.

TECHNICAL FIELD

The present disclosure relates to the field of display panel manufacture, and in particularly to a mask plate frame and a mask plate assembly.

BACKGROUND

In a forming process of an organic light emitting diode (OLED) display screen, a high-precision metal mask plate is usually used, and an evaporation material is heated thereunder to make the material evaporate or sublimate upward and penetrate through a pre-designed opening of the mask plate and deposit on a surface of a substrate to be evaporated to form a pattern of a desired film layer.

The mask plate commonly includes masks and shielding films, the masks and the shielding films are all need to be welded on a frame. A plurality of masks needs to realize a combination with the frame, that is, to realize stretching. Each of the shielding films is welded on a gap between adjacent two masks to play a function of shielding the gap to prevent the material from being evaporated to the substrate from the gap and resulting in a color mixture or a contamination of the substrate.

In general, welding of stretching is performed according to the following steps: first, the shielding film is welded on the frame, and then the mask is welded, and because of the existence of an overlapped connection between the mask and the shielding film, welding may not be performed, and an edge of a thinner mask easily be wrinkled or curled, which lowers a yield rate of evaporation.

Once a defect of stretching occurs or a usage defect of the mask occurs due to having been used for a long time, the mask needs to be replaced, therefore it is necessary to tear the mask and the shielding film out from the frame and polish a welding point of the frame. Since there is a higher requirement for flatness of the welding point, in general, a usage period of the frame is 2~3 times, after this period, the frame may not be reused.

SUMMARY

An object of the present disclosure is to provide a mask plate frame and a mask plate assembly, so as to prevent the edge of mask from being warped or wrinkled, reduce a waste of the frame and the shielding film when replacing the mask, and reduce the material cost.

A mask plate frame is provided by the present disclosure, including a first frame body provided with at least one first supporting portion; and a second frame body arranged on a supporting surface of the first supporting portion.

Optionally, the first frame body further includes at least one second supporting portion, a first distance between the supporting surface of the first supporting portion and a bottom surface of the first frame body is larger than a second distance between a supporting surface of the second supporting portion and the bottom surface of the first frame body; and an orthogonal projection of the second supporting portion onto a plane parallel to the bottom surface of the first frame body is completely within an orthogonal projection of the first supporting portion onto the plane parallel to the bottom surface of the first frame body.

Optionally, the supporting surface of the first supporting portion and the supporting surface of the second supporting portion are parallel to each other.

Optionally, the first frame body is a hollow square frame, the first supporting portion is a supporting plate projecting from an inner side wall of the first frame body, the supporting plate is arranged on the inner side wall of the first frame body in succession to form a hollow square structure, and an upper surface of the supporting plate is the supporting surface of the first supporting portion.

Optionally, the second supporting portions include two grooves arranged on the supporting plate and opposite to each other along an extension direction of a shielding film, and a side of each of the grooves towards an opposite groove is provided with an opening.

Optionally, a height of the opening is identical to a depth of the groove, and a bottom surface of the groove is the supporting surface of the second supporting portion.

Optionally, the supporting surface of the first supporting portion is parallel to a bottom surface of the first frame body.

Optionally, the first frame body further includes a plurality of second supporting portions; and the second supporting portions are arranged respectively at opposite two sides of the first supporting portion of the hollow square structure, and each of the second supporting portions is a groove arranged on the supporting surface of the first supporting portion.

Optionally, a bottom surface of the groove is the supporting surface of the second supporting portion and extends to the inner side wall of the first supporting portion perpendicular to the bottom surface of the first frame body.

A mask plate assembly is further provided by the present disclosure, including the mask plate frame above, the mask plate assembly further includes: at least one shielding film fixed on a surface of the second frame body away from the bottom surface of the first frame body; and a plurality of masks fixed on the surface of the second frame body away from the bottom surface of the first frame body, wherein the shielding film shields a gap between adjacent two masks.

Optionally, an orthogonal projection of the gap between adjacent two masks onto the bottom surface of the first frame body is within an orthogonal projection of the shielding film onto the bottom surface of the first frame body.

Optionally, an orthogonal projection of the shielding film onto the bottom surface of the first frame body partially overlaps orthogonal projections of adjacent two masks onto the bottom surface of the first frame body.

A mask plate assembly is further provided by the present disclosure, including the mask plate frame above, and the mask plate assembly further includes: a plurality of masks fixed on a surface of the second frame body away from the bottom surface of the first frame body; and a shielding film arranged on the supporting surface of the second supporting portion, wherein the shielding film is capable of shielding a gap between adjacent two masks.

Optionally, an edge and four corners of each mask are fixed on the second frame body.

Optionally, the shielding film is welded on the second frame body.

Optionally, the shielding film is fixed on a surface of the second frame body close to the bottom surface of the first frame body.

Optionally, the orthogonal projection of the gap between adjacent two mask plates onto the bottom surface of the first frame body is within the orthogonal projection of the shielding film onto the bottom surface of the first frame body.

DRAWINGS REFERENCES

1—first frame body, 11—first supporting portion, 12—second supporting portion, 2—second frame body, 3—mask, 4—shielding film

DETAILED DESCRIPTION

In order to further understand the present disclosure, optional implementations of the present disclosure will be described hereinafter in conjunction with the embodiments. However it should be understood that, these descriptions are merely intended to further describe features and advantages of the present disclosure, rather than limit claims of the present disclosure.

Figure 1:
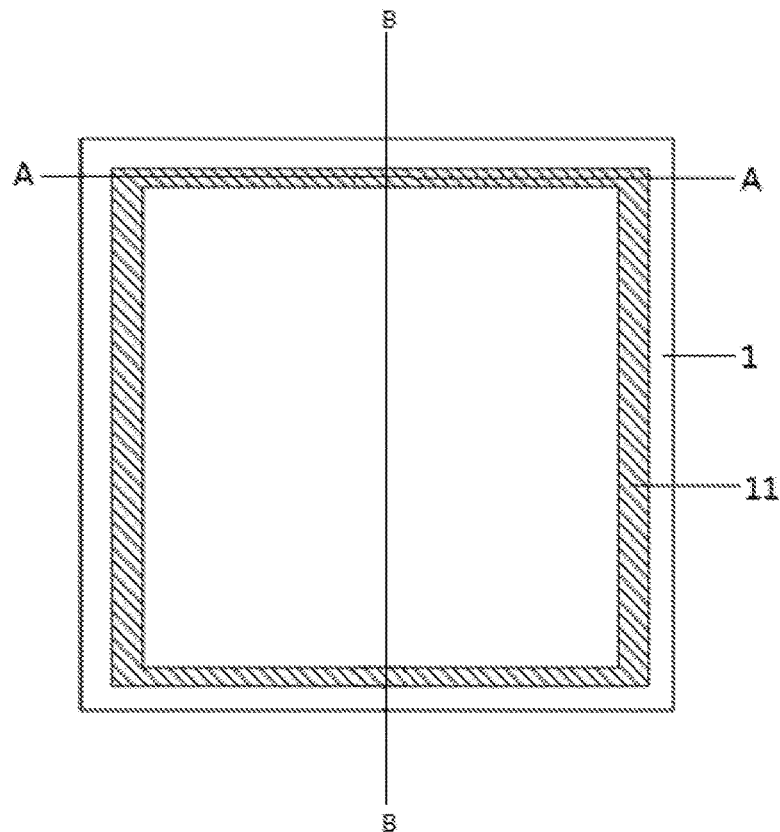
FIG. 1 is a top view of a mask plate frame in at least one embodiment of the present disclosure.
Figure 2:
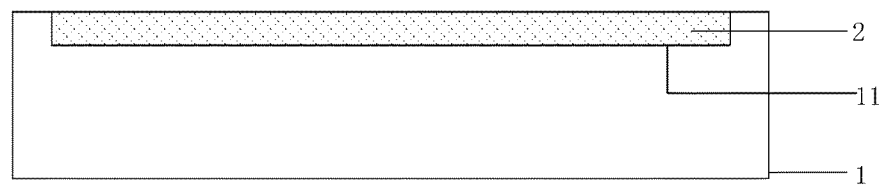
FIG. 2 is a sectional view of the mask plate frame shown in FIG. 1 along an A-A direction.

FIG. 1 is a top view of a mask plate frame in some embodiments of the present disclosure. FIG. 2 is a sectional view of the mask plate frame shown in FIG. 1 along an A-A direction.

The present disclosure provides in at least one embodiment a mask plate frame, as shown in FIG. 1 and FIG. 2, the mask plate frame includes: a first frame body 1 and a second frame body 2 arranged on a supporting surface of the first supporting portion 11.

In at least one embodiment of the present disclosure, the first supporting portion 11 may be of a plurality of shapes, as long as the first supporting portion 11 may support the second frame body.

Figure 3:
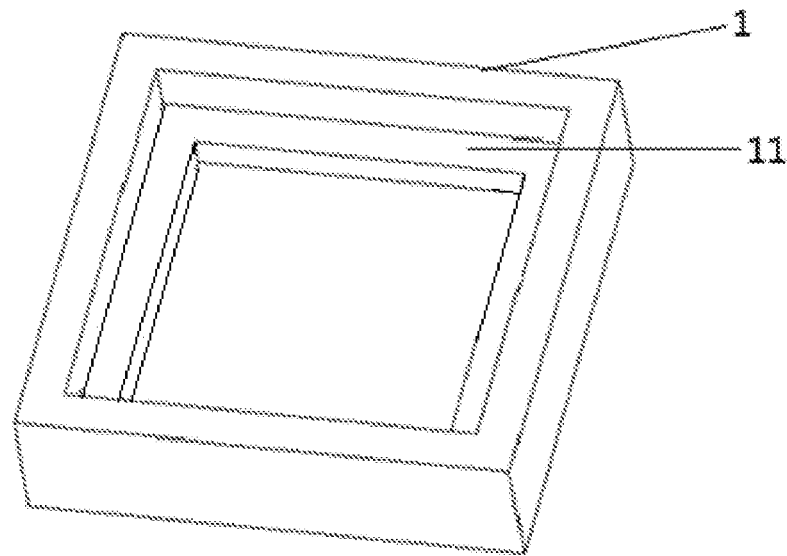
FIG. 3 is a schematic view of the mask plate frame shown in FIG. 1.
Figure 4:
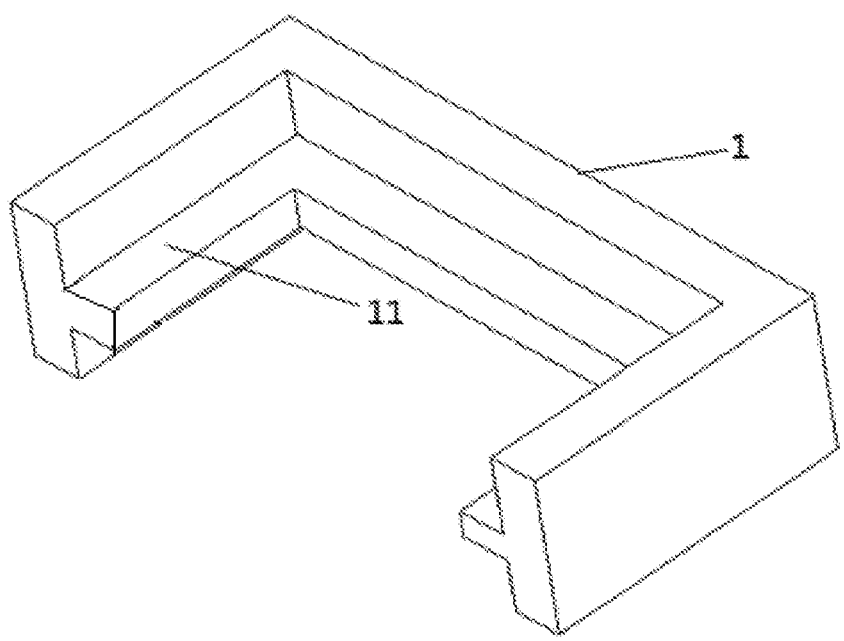
FIG. 4 is a sectional view of the mask plate frame shown in FIG. 1 along a B-B direction.

As shown in FIG. 3 and FIG. 4, in at least one embodiment of the present disclosure, the supporting surface of the first supporting portion 11 is parallel to a bottom surface of the first frame body 1.

Figure 5:
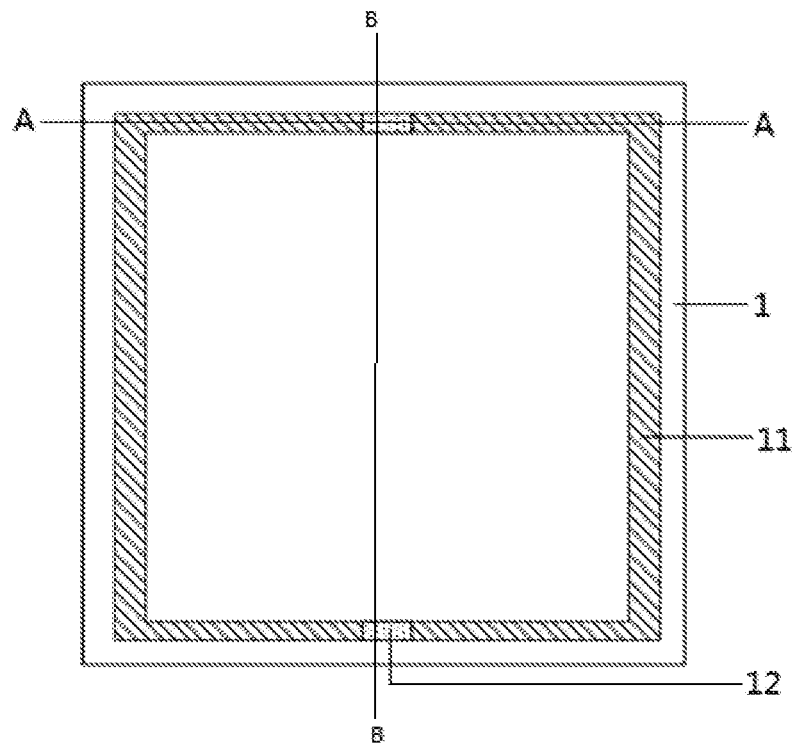
FIG. 5 is a top view of a mask plate frame in at least one embodiment of the present disclosure.
Figure 6:
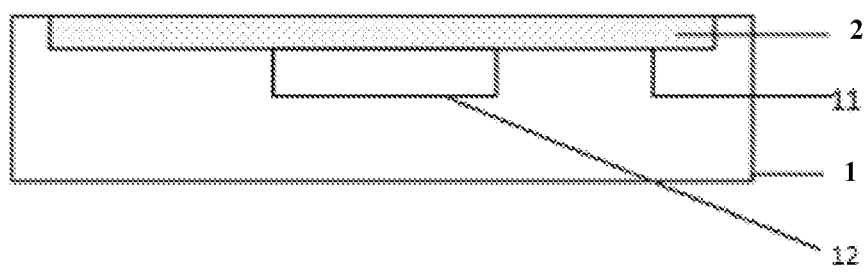
FIG. 6 is a sectional view of the mask plate frame shown in FIG. 5 along an A-A direction.

The present disclosure provides in at least one embodiment a mask plate frame, as shown in FIG. 5 and FIG. 6, the mask plate frame includes: the first frame body 1 provided with the first supporting portion 11 and a second supporting portion 12.

A first distance between the supporting surface of the first supporting portion 11 and a bottom surface of the first frame body 1 is larger than a second distance between a supporting surface of the second supporting portion 12 and the bottom surface of the first frame body 1;

An orthogonal projection of the second supporting portion 12 onto a plane parallel to the bottom surface of the first frame body 1 is completely within an orthogonal projection of the first supporting portion 11 onto the plane parallel to the bottom surface of the first frame body 1.

In at least one embodiment of the present disclosure, the first supporting portion 11 may be of a plurality of shapes, as long as the first supporting portion 11 may support the second frame body. Since the second supporting portion is configured to arrange a shielding film, in order to make the shielding film shield a gap between masks better and prevent an evaporation material from penetrating through the gap, the supporting surface of the first supporting portion 11 is parallel to the supporting surface of the second supporting portion 12.

According to features of a mask frame, in at least one embodiment of the present disclosure, the first frame body is a hollow square frame, the first supporting portion is a supporting plate projecting from an inner side wall of the first frame body, the supporting plate is arranged on the inner side wall of the first frame body in succession to form a hollow square structure, and an upper surface of the supporting plate is the supporting surface of the first supporting portion.

Optionally, a thickness of the first frame body is in a range of 5~100 mm. A thickness of the second frame is in a range of 2.5~80 mm. Optionally, a distance between the supporting surface of the first supporting portion and a top surface of the first frame body is in a range of 3~85 mm.

An orthogonal projection of the second supporting portion 12 onto a plane parallel to the bottom surface of the first frame body 1 is completely within an orthogonal projection of the first supporting portion 11 onto the plane parallel to the bottom surface of the first frame body 1.

Figure 7:
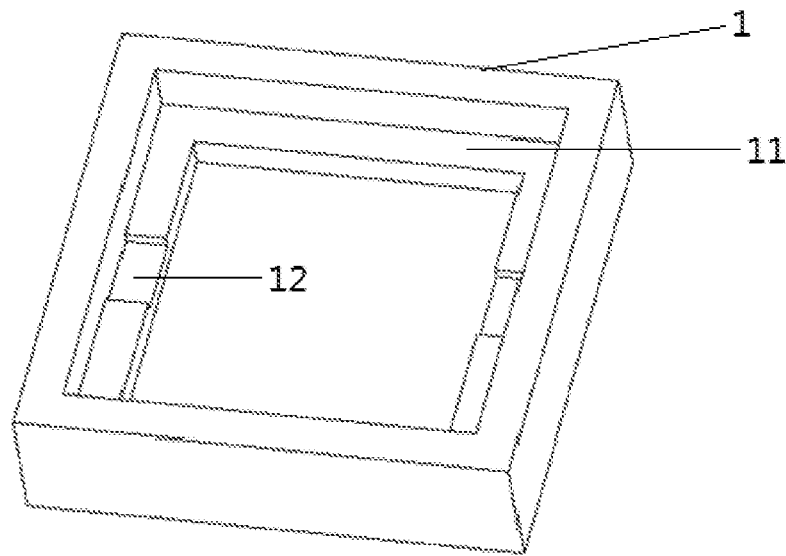
FIG. 7 is a schematic view of the mask plate frame shown in FIG. 5.

Furthermore, as shown in FIG. 7, the frame includes at least one the second supporting portion, the second supporting portions include two grooves arranged on the supporting plate and opposite to each other along an extension direction of a shielding film, and a side of each of the grooves towards an opposite groove is provided with an opening. Optionally, a height of the opening is identical to a depth of the groove, and a bottom surface of the groove is the supporting surface of the second supporting portion. Optionally, the depth of the groove is in a range of 30~200 μm.

Figure 8:
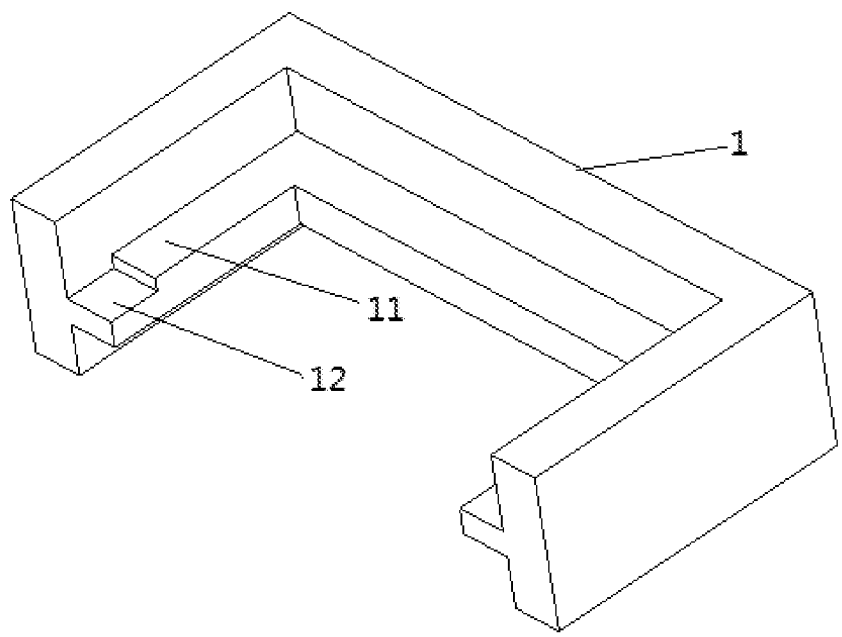
FIG. 8 is a sectional view of the mask plate frame shown in FIG. 5 along an B-B direction.

FIG. 8 is a sectional view of the mask plate frame in at least one embodiment of the present disclosure along the B-B direction.

Optionally, the second frame is a hollow square frame, a middle of which is hollowed out, and the second frame is arranged on the supporting surface of the first supporting portion.

As shown in FIG. 7 and FIG. 8, in at least one embodiment of the present disclosure, the first frame body 1 further includes a plurality of second supporting portions 12. The second supporting portions 12 are arranged respectively at opposite two sides of the first supporting portion 11 of the hollow square structure respectively, and each of the second supporting portions 12 is a groove arranged on the supporting surface of the first supporting portion 11. A bottom surface of the groove is the supporting surface of the second supporting portion 12 and extends to the inner side wall of the first supporting portion 11 perpendicular to the bottom surface of the first frame body 1.

Figure 9:
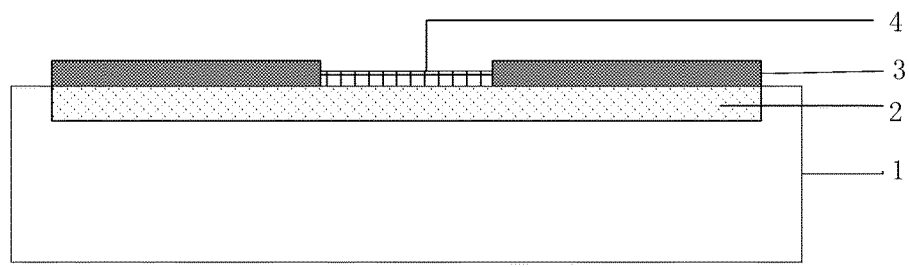
FIG. 9 is a sectional view of a mask plate assembly in at least one embodiment of the present disclosure.

The present disclosure further discloses in at least one embodiment a mask plate assembly, as shown in FIG. 9, the mask plate assembly includes the first frame body 1 and the second frame body 2 arranged on the supporting surface of the first supporting portion 11, and the mask plate assembly further includes: a plurality of shielding films fixed on a surface of the second frame body away from the bottom surface of the first frame body; and a plurality of masks fixed on the surface of the second frame body away from the bottom surface of the first frame body, that is, the mask and the shielding film are located at a same side of the second frame body. Optionally, edges of the mask and the shielding film are partially overlapped.

In at least one embodiment of the present disclosure, an orthogonal projection of the shielding film 4 onto the bottom surface of the first frame body 1 partially overlaps orthogonal projections of adjacent two masks 3 onto the bottom surface of the first frame body 1.

The shielding film shields a gap between adjacent two masks.

In at least one embodiment of the present disclosure, an orthogonal projection of the gap between the adjacent two masks 3 onto the bottom surface of the first frame body 1 is within the orthogonal projection of the shielding film 4 onto the bottom surface of the first frame body 1.

Figure 10:
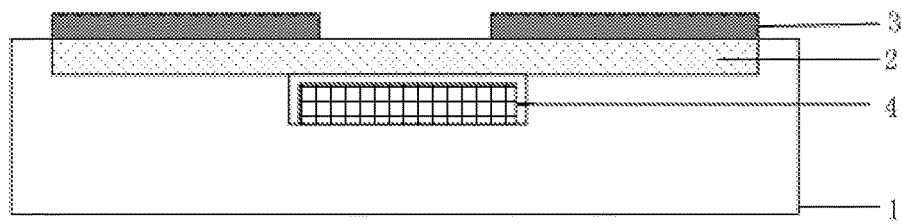
FIG. 10 is a sectional view of a mask plate assembly in at least one embodiment of the present disclosure.
Figure 11:
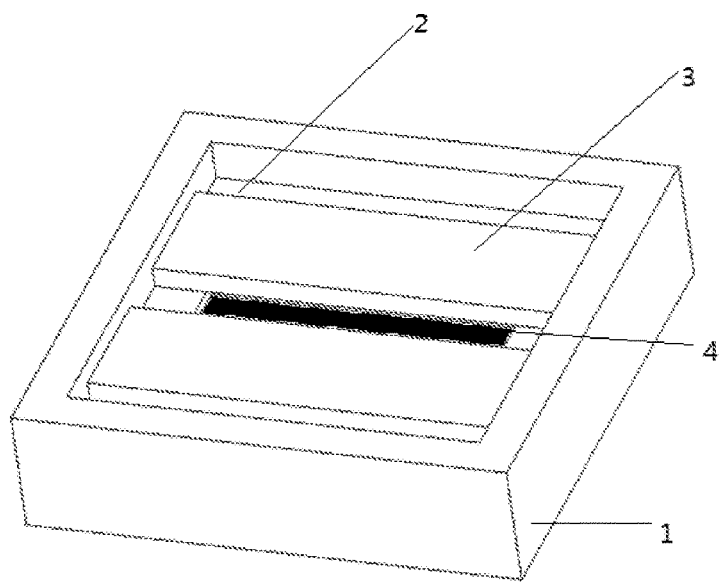
FIG. 11 is a schematic view of the mask plate assembly shown in FIG. 10.

The present disclosure provides in at least one embodiment a mask plate assembly, as shown in FIG. 10 and FIG. 11, the mask plate assembly includes the mask plate frame above, and further includes: a plurality of masks 3 fixed on a surface of the second frame body 2 away from the bottom surface of the first frame body; and a shielding film 4 arranged on the supporting surface of the second supporting portion, and the shielding film 4 is capable of shielding the gap between adjacent two masks 3.

In at least one embodiment of the present disclosure, the orthogonal projection of the gap between adjacent two masks 3 onto the bottom surface of the first frame body 1 is within the orthogonal projection of the shielding film 4 onto the bottom surface of the first frame body.

There may be 2 or more masks. Optionally, an edge and four corners of each mask are all fixed on the second frame body, thereby preventing the corners of the mask to be suspend, and reducing a defect of warping or wrinkling of the mask. When replacing the mask, the second frame having the mask may be removed directly and be replaced with a new second frame, thereby increasing a use ratio of the first frame and reducing a cost of the mask assembly.

Figure 12:
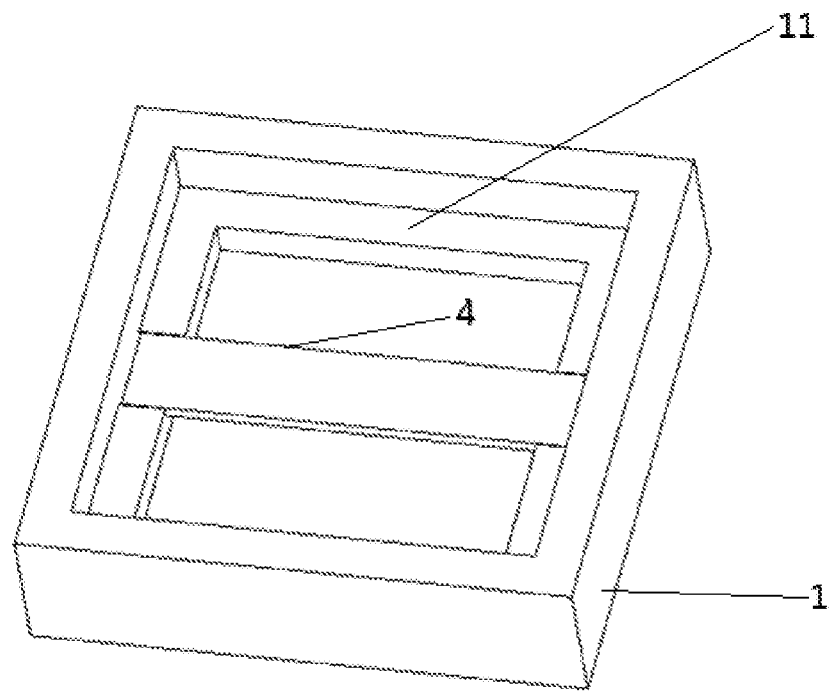
FIG. 12 is a schematic view of a shielding film in the mask plate assembly shown in FIG. 10.

The shielding film is capable of shielding a gap between adjacent masks. In at least one embodiment of the present disclosure, the shielding film is fixed on the supporting surface of the second supporting portion. Optionally, the shielding film is welded on the supporting surface of the second supporting portion. When the mask needs to be replaced, there is no need to change the shielding film. FIG. 12 is schematic view of a shielding film in the mask plate assembly in at least one embodiment of the present disclosure, where drawing reference 4 represents a shielding film.

Figure 13:
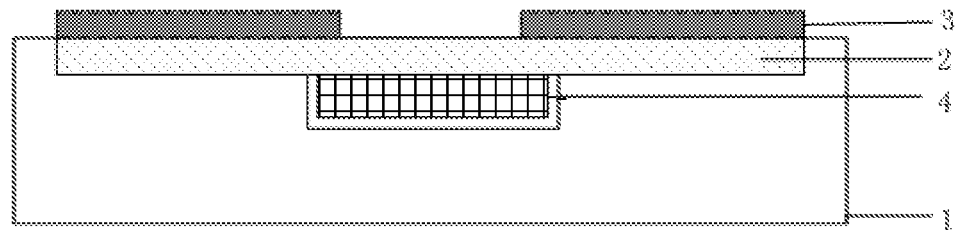
FIG. 13 is a sectional view of a mask plate assembly in at least one embodiment of the present disclosure.

In at least one embodiment of the present disclosure, as shown in FIG. 13, the shielding film is fixed on the second frame body. Optionally, the shielding film is welded on the second frame body. In this case, the shielding film and the mask are respectively fixed on two opposite surfaces of the second frame body. A surface of the shielding film at one side thereof is connected, and fixed to the second frame body, and a surface of the shielding film at another side thereof is arranged on the supporting surface of the second supporting portion.

The above descriptions of the embodiments are merely intended to facilitate understanding of the methods and the core thought thereof. It should be noted that, a person skilled in the art may make improvements and modifications without departing from the principle of the present disclosure, and these improvements and modifications shall also fall within the scope of the present disclosure.

The above descriptions of the embodiments enable a person skilled in the art to implement or use the present disclosure. Various modifications of the embodiments are apparent to a person skilled in the art, and the general principle defined in the present disclosure may be implemented in other embodiments without departing from the principle or the scope of the present disclosure. Therefore, the present disclosure shall not be limited to these embodiments shown in the present disclosure, instead, should conform to a widest scope consistent with the principle and the new features of the present disclosure.

What is claimed is:

1. A mask plate frame, comprising:
a first frame body provided with a first supporting portion; and
a second frame body, arranged on a supporting surface of the first supporting portion, and detachable from the supporting surface of the first supporting portion;
wherein the first frame body comprises at least one second supporting portion;
wherein a first distance between the supporting surface of the first supporting portion and a bottom surface of the first frame body is larger than a second distance between a supporting surface of the second supporting portion and the bottom surface of the first frame body; and
wherein an orthogonal projection of the second supporting portion onto a plane parallel to the bottom surface of the first frame body is within an orthogonal projection of the first supporting portion onto the plane parallel to the bottom surface of the first frame body.

2. The mask plate frame according to claim 1, wherein the supporting surface of the first supporting portion and the supporting surface of the second supporting portion are parallel to each other.

3. The mask plate frame according to claim 2, wherein the first frame body is a hollow square frame, the first supporting portion is a supporting plate projecting from an inner side wall of the first frame body, the supporting plate is arranged on the inner side wall of the first frame body in succession to form a hollow square structure, and an upper surface of the supporting plate is the supporting surface of the first supporting portion.

4. The mask plate frame according to claim 3, wherein the second supporting portions comprise two grooves arranged on the supporting plate and opposite to each other along an extension direction of a shielding film, and a side of each of the grooves towards an opposite groove is provided with an opening.

5. The mask plate frame according to claim 4, wherein a height of the opening is identical to a depth of the groove, and a bottom surface of the groove is the supporting surface of the second supporting portion.

6. The mask plate frame according to claim 3, wherein the first frame body comprises a plurality of second supporting portions; and the second supporting portions are arranged respectively at opposite two sides of the first supporting portion of the hollow square structure, and each of the second supporting portions is a groove arranged on the supporting surface of the first supporting portion.

7. The mask plate frame according to claim 6, wherein a bottom surface of the groove is the supporting surface of the second supporting portion and extends to the inner side wall of the first supporting portion perpendicular to the bottom surface of the first frame body.

8. The mask plate frame according to claim 1, wherein the supporting surface of the first supporting portion is parallel to a bottom surface of the first frame body.

9. A mask plate assembly, comprising the mask plate frame according to claim 1, wherein the mask plate assembly further comprises:

a plurality of masks fixed on a surface of the second frame body away from the bottom surface of the first frame body; and a shielding film arranged on the supporting surface of the second supporting portion, wherein the shielding film shields a gap between adjacent two masks.

10. The mask plate assembly according to claim 9, wherein an edge and four corners of each mask are fixed on the second frame body.

11. The mask plate assembly according to claim 9, wherein the shielding film is welded on the second frame body.

12. The mask plate assembly according to claim 9, wherein the shielding film is fixed on a surface the second frame body close to the bottom surface of the first frame body.

13. The mask plate assembly according to claim 9, wherein an orthogonal projection of the gap between adjacent two masks onto the bottom surface of the first frame body is within an orthogonal projection of the shielding film onto the bottom surface of the first frame body.

* * * * *